US010630251B2

(12) United States Patent
Kagano et al.

(10) Patent No.: US 10,630,251 B2
(45) Date of Patent: Apr. 21, 2020

(54) BIAS CURRENT CIRCUIT, SIGNAL PROCESSING DEVICE, AND BIAS CURRENT CONTROL METHOD

(71) Applicant: Mitsubishi Electric Corporation, Chiyoda-ku (JP)

(72) Inventors: Miki Kagano, Chiyoda-ku (JP); Tomokazu Ogomi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 25 days.

(21) Appl. No.: 16/095,861

(22) PCT Filed: May 11, 2017

(86) PCT No.: PCT/JP2017/017881
§ 371 (c)(1),
(2) Date: Oct. 23, 2018

(87) PCT Pub. No.: WO2017/195864
PCT Pub. Date: Nov. 16, 2017

(65) Prior Publication Data
US 2020/0036350 A1    Jan. 30, 2020

(30) Foreign Application Priority Data

May 12, 2016   (JP) .................................. 2016-096394

(51) Int. Cl.
*H03F 3/68* (2006.01)
*G07D 7/004* (2016.01)
(Continued)

(52) U.S. Cl.
CPC .............. *H03F 3/68* (2013.01); *G07D 7/004* (2013.01); *G07D 7/04* (2013.01); *H03K 17/687* (2013.01);
(Continued)

(58) Field of Classification Search
CPC ................. H03F 3/68; H03F 2200/228; H03F 2200/294; G07D 7/04; G07D 7/004; H03K 17/687
(Continued)

(56) References Cited

U.S. PATENT DOCUMENTS 6,163,206 A    12/2000  Kobayashi
6,170,631 B1    1/2001  Miyazaki
(Continued)

FOREIGN PATENT DOCUMENTS

JP    11-296245 A    10/1999
JP    2000-48237 A    2/2000
(Continued)

OTHER PUBLICATIONS

International Search Report dated Aug. 1, 2017 in PCT/JP2017/017881 filed May 11, 2017.
(Continued)

*Primary Examiner* — Melissa J Koval
*Assistant Examiner* — Trung Nguyen
(74) *Attorney, Agent, or Firm* — Oblon, McClelland, Maier & Neustadt, L.L.P.

(57) ABSTRACT

A bias current circuit includes: an N-type MOSFET in which a gate terminal and a drain terminal are connected to a current source, and N-type MOSFETs in which respective drain terminals are connected to respective bias current output terminals and source terminals are grounded. The bias current circuit further includes: an N-type MOSFET in which one terminal type, either a drain terminal or a source terminal, is connected to the gate terminal of the N-type MOSFET, and the other terminal type is connected to the gate terminals of the N-type MOSFETs, and an N-type MOSFET in which a drain terminal is connected to the gate terminals of the N-type MOSFETs and a source terminal is
(Continued)

grounded. A control signal, that is LOW when the bias current is supplied and is HIGH when the bias current is not supplied, is input to the gate terminal of the N-type MOSFET, and an inverse signal of the control signal is input to the gate terminal of the N-type MOSFET.

12 Claims, 9 Drawing Sheets

(51) Int. Cl.
*G07D 7/04* (2016.01)
*H03K 17/687* (2006.01)

(52) U.S. Cl.
CPC .. *H03F 2200/228* (2013.01); *H03F 2200/294* (2013.01)

(58) Field of Classification Search
USPC .. 324/500, 750.3, 757.04, 762.03, 600, 663, 324/671, 200, 207.13, 207.22, 210, 239, 324/241, 515, 520, 530, 76.11, 105–124; 330/267, 277, 255, 262–265; 327/512–513, 534–543
See application file for complete search history.

(56) References Cited

U.S. PATENT DOCUMENTS

| | | | |
|---|---|---|---|
| 7,242,252 B2* | 7/2007 | Taylor | G05F 3/205 330/285 |
| 9,519,304 B1* | 12/2016 | Far | G05F 3/262 |
| 2014/0197828 A1 | 7/2014 | Kagano et al. | |

FOREIGN PATENT DOCUMENTS

| | | |
|---|---|---|
| JP | 2002-232277 A | 8/2002 |
| JP | WO 2012/173112 A1 | 12/2012 |
| JP | 2015-37287 A | 2/2015 |
| WO | WO 2012/042680 A1 | 4/2012 |

OTHER PUBLICATIONS

Japanese Office Action dated Feb. 13, 2018 in Patent Application No. 2017-564151, citing documents AN and AQ therein (with English translation).

Japanese Office Action dated May 15, 2018 in Patent Application No. 2017-564151, citing documents AN-AQ and AS therein (with English translation).

Japanese Office Action (Decision to Decline the Amendment) dated Aug. 7, 2018 in Patent Application No. 2017-564151, citing documents AN-AQ and AS therein (with English translation).

* cited by examiner

BIAS CURRENT CIRCUIT, SIGNAL PROCESSING DEVICE, AND BIAS CURRENT CONTROL METHOD

TECHNICAL FIELD

The present disclosure relates to a bias current circuit for supplying or stopping a bias current to an electronic circuit, a signal processing device having a bias current control function, and a bias current control method.

BACKGROUND ART

A conventional technology reads an image by using a sensor array that includes multiple sensor elements lined up in a single row. For example, a magnetic sensor device for reading magnetic information printed on paper with magnetic ink reads the magnetic information by using bridge-connected magnetoresistive elements that have a property that is change of resistance upon application of a magnetic field.

In a magnetic sensor device for detection of a minute magnetic pattern such as that of paper currency, the change of resistance of the magnetoresistive element is minute due to minuteness of the amount of magnetism of the magnetic pattern used for the paper currency. Thus a sensor output signal read from mid-points of the bridge-connected magnetoresistive elements is minute. Thus acquisition of the pattern information requires that the sensor output signal in a low noise state is amplified at a high gain of about 1,000.

An amplifier that achieves high gain and low noise has high current consumption, and due to connection of such an amplifier to each of the magnetoresistive elements, many amplifiers operate, and power consumption increases. Due to such increase, a problem of increased cost occurs with increased capacity of a power supply that supplies power to the device, and heat generated by the device lowers working life of components mounted within the device, posing a problem in that a mechanism is required for dissipation of the heat.

In response to such problems, technology is proposed that suppresses power consumption by setting the amplifiers to an operating state only when reading an image, and by stopping the bias current during a wait state of the circuit when circuit operation is not required (for example, Patent Literature 1). Patent Literature 1 describes an ability to realize outputting and stopping of the bias current by appending a control circuit to a current output terminal of a current mirror circuit.

CITATION LIST

Patent Literature

Patent Literature 1: Unexamined Japanese Patent Application Kokai Publication No. 2015-37287

SUMMARY OF INVENTION

Technical Problem

The bias current circuit disclosed in Patent Literature 1 includes a first and a second bipolar transistor, and the first and second bipolar transistors form a first differential pair. A third bipolar transistor that is connected in parallel to the first differential pair for applying a standard voltage to a control terminal, and a fourth bipolar transistor that is connected in series with the first differential pair for applying to the control terminal a control voltage corresponding to the standard voltage, are further included, and the third and fourth bipolar transistors form a second differential pair. Further, four MOS transistors are provided and are connected to the first differential pair for outputting the bias current on the basis of the current output from the first bipolar transistor.

This bias current circuit has problems in that the circuit includes a large number of transistors, the configuration requires inputting of numerous standard voltages to the transistors and inputting of numerous control signals matching such standard voltages, and scale of the circuit increases.

In consideration of the aforementioned circumstances, an objective of the present disclosure is to provide a bias current circuit having a simple configuration and capable of switching by a single control signal alone between supplying and stopping of the bias current.

Solution to Problem

In order to attain the aforementioned objective, a bias current circuit of the present disclosure includes: a first field-effect transistor in which a current source is connected to a drain terminal and a gate terminal, a second field-effect transistor in which a first electronic circuit to be supplied a bias current is connected to a drain terminal, a third field-effect transistor in which a source terminal is connected to the gate terminal of the first field-effect transistor and a drain terminal is connected to a gate terminal of the second field-effect transistor, a fourth field-effect transistor in which a drain terminal and a source terminal are respectively connected to the gate terminal and a source terminal of the second field-effect transistor, and a plurality of fifth field-effect transistors in which each gate terminal of gate terminals is connected to the gate terminal of the second field-effect transistor and each source terminal of source terminals is connected to the source terminal of the second field-effect transistor.

Each of a plurality of second electronic circuits to be supplied the bias current is connected to a respective chain terminal of the fifth field-effect transistors. Each of the plurality of second electronic circuits is connected to the first electronic circuit via a switch of a plurality of switches corresponding to the second electronic circuits, each second electronic circuit becoming electrically connected to the first electronic circuit when the corresponding switch is made conductive. The first, second, third, fourth, and fifth field-effect transistors are P-type metal oxide semiconductor field effect transistors (MOSFETs). A positive voltage source is connected to the source terminals of the first, second, fourth, and fifth field-effect transistors.

A control signal for switching in response to whether the bias current is to be supplied is input to a gate terminal of the third field-effect transistor, and an inverse signal of the control signal is input to a gate terminal of the fourth field-effect transistor.

When the bias current is to be supplied to the first electronic circuit and the second electronic circuit, the control signal is set to a low level, connection is made conductive between the drain terminal and the source terminal of the third field-effect transistor, and connection is made non-conductive between the drain terminal and the source terminal of the fourth field-effect transistor.

When supplying of the bias current is to be stopped to the first electronic circuit and the second electronic circuit, the control signal is set to a high level, connection is made non-conductive between the drain terminal and the source terminal of the third field-effect transistor, and connection is made conductive between the drain terminal and the source terminal of the fourth field-effect transistor.

Advantageous Effects of Invention

According to the present disclosure, switching between supplying and stopping of the bias current can be performed by a simple configuration using a single control signal alone.

DESCRIPTION OF EMBODIMENTS

Embodiment 1

Figure 1:
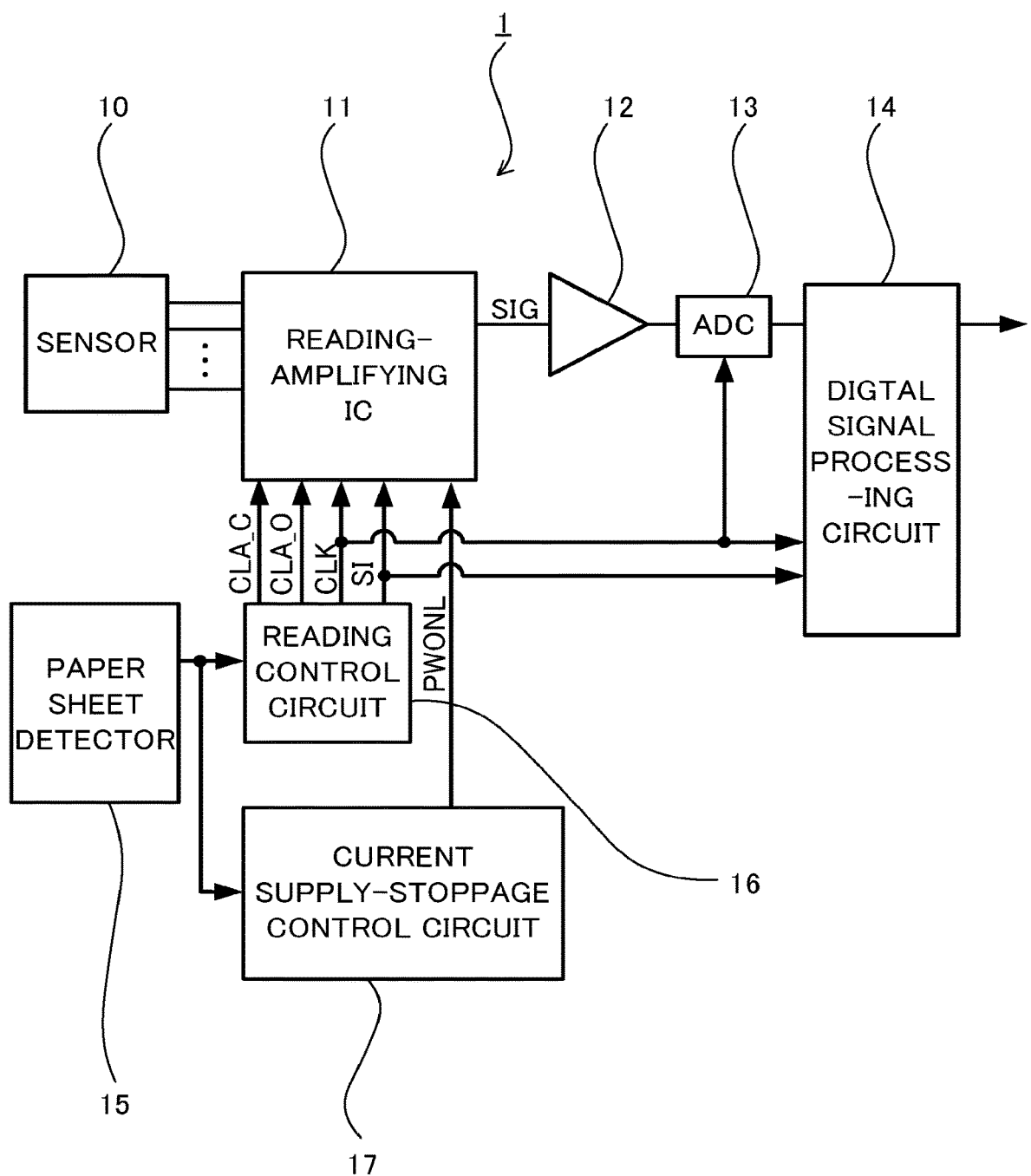
FIG. 1 is a block diagram illustrating a configuration of a signal processing device according to Embodiment 1 of the present disclosure.

FIG. 1 illustrates a configuration of a signal processing device 1 according to Embodiment 1 of the present disclosure. As illustrated in FIG. 1, the signal processing device 1 according to the present embodiment includes: a sensor 10 including multiple sensor elements, and a reading-amplifying integrated circuit (IC, semiconductor integrated circuit) 11 that has functions for sequential reading and amplifying of sensor signals output from each of the sensor elements.

The signal processing device 1 further includes: an amplifier 12 for further amplifying an output signal (SIG) output from the reading-amplifying IC 11, an analog-digital (AD) converter 13 for conversion of an analog signal output from the amplifier 12 to a digital signal, and a digital signal processing circuit 14 for executing signal processing of the digital signal output from the AD converter 13.

The signal processing device 1 further includes: a paper sheet detector 15 for detecting that a paper sheet printed with magnetic ink is present within a predetermined range, and a reading control circuit 16 and a current supply-stoppage control circuit 17 for outputting a control signal to the reading-amplifying IC 11. The reading control circuit 16 outputs to the reading-amplifying IC 11: a clamp signal (CLA_C, CLA_O) on the basis of a detection signal indicating that the paper sheet detector 15 detects the paper sheet, a reading-initiation signal (SI), and a clock signal (CLK). The current supply-stoppage control circuit 17 outputs to the reading-amplifying IC 11 a current control signal (PWONL) on the basis of the detection signal from the paper sheet detector 15.

The clock signal (CLK) is also input to both the AD converter 13 and the digital signal processing circuit 14, and the reading-initiation signal (SI) is also input to the digital signal processing circuit 14.

The sensor 10 includes multiple sensor elements. Each of the sensor elements included in the sensor 10 is a freely-selected type of element for detection of freely-selected information, and each of the sensor elements has similar performance. A case is described in the present embodiment in which the sensor elements are configured as magnetoresistive (MR) elements 101 and 102 that detect magnetic information printed with magnetic ink on paper and convert the magnetic information into electrical information.

Figure 2:
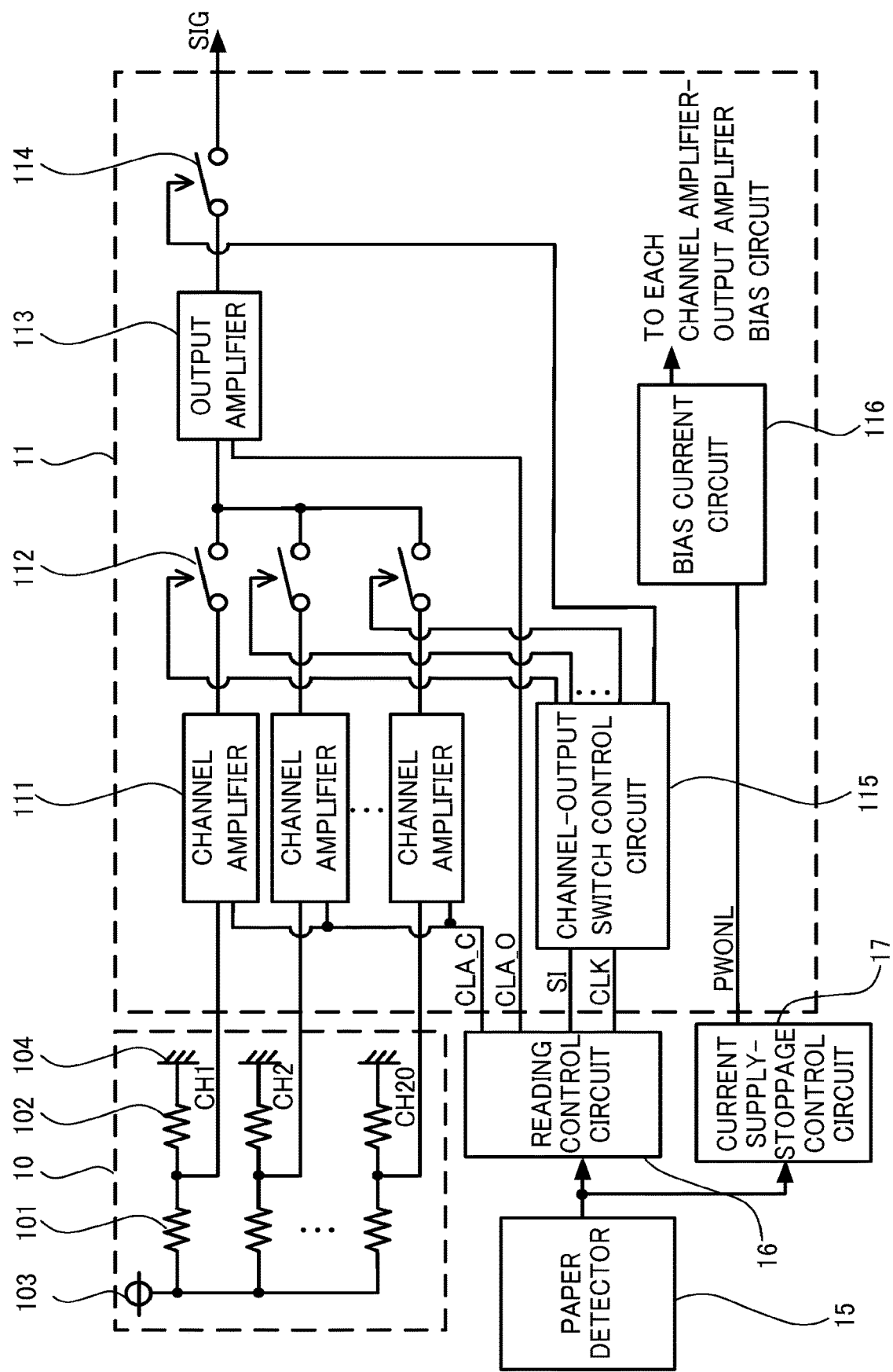
FIG. 2 is a drawing illustrating details of a configuration of a portion of the signal processing device according to Embodiment 1.

FIG. 2 is a drawing illustrating details of a configuration of a portion of the signal processing device 1. As illustrated in FIG. 2, the sensor 10 has an array of n bridge-connected pairs of MR elements 101 and 102, both ends of each bridge-connected pair connecting to an MR power source 103 and a ground (GND) 104. Here, the array has 20 channels (CH) from CH1 to CH20. The sensor 10 outputs to the reading-amplifying IC 11 the voltage of a mid-point that is a connection point between the MR element 101 and the MR element 102.

As illustrated in FIG. 2, the reading-amplifying IC 11 includes: a channel amplifier 111 amplifying as input the mid-point voltage of the MR elements 101 and 102 output from the sensor 10, and a channel switch 112 for switching between conducting and non-conducting the output of the channel amplifier 111. The number of the channel amplifiers 111 and the channel switches 112 is the same as the number of channels of the sensor 10, and the present embodiment includes 20 each of the channel amplifiers 111 and the channel switches 112.

Further, the reading-amplifying IC 11 includes: an output amplifier 113 that amplifies an output of a single channel amplifier 111 that is output via conductivity of one switch among the 20 channel switches 112, and an output switch 114 for switching between conducting and non-conducting the output of the output amplifier 113.

The reading-amplifying IC 11 further includes: a channel-output switch control circuit 115 that performs control of conductivity-non-conductivity of the channel switch 112 and the output switch 114, and a bias current circuit 116 for performing or stopping the supply of the bias current to the channel amplifier 111 and the output amplifier 113.

Using as a trigger the reading-initiation signal (SI) input from the reading control circuit 16, the channel-output switch control circuit 115 performs sequential switching of the channel switch 112 at the timing of the clock signal (CLK). Thus an amplification signal amplifying the mid-point voltage of each channel by the channel amplifier 111 can be output one channel at a time.

Further, the channel-output switch control circuit 115 outputs a control signal that makes the output switch 114 conductive when one of the channel switches 112 is made conductive on the basis of the clock signal (CLK) and the reading-initiation signal (SI) output from the reading control circuit 16 and the amplification signal is output, and that makes the output switch 114 non-conductive at other times. Thus the reading-amplifying IC 11 outputs the output signal (SIG) further amplifying the signal output of the channel amplifier 111 by the output amplifier 113.

Figure 3:
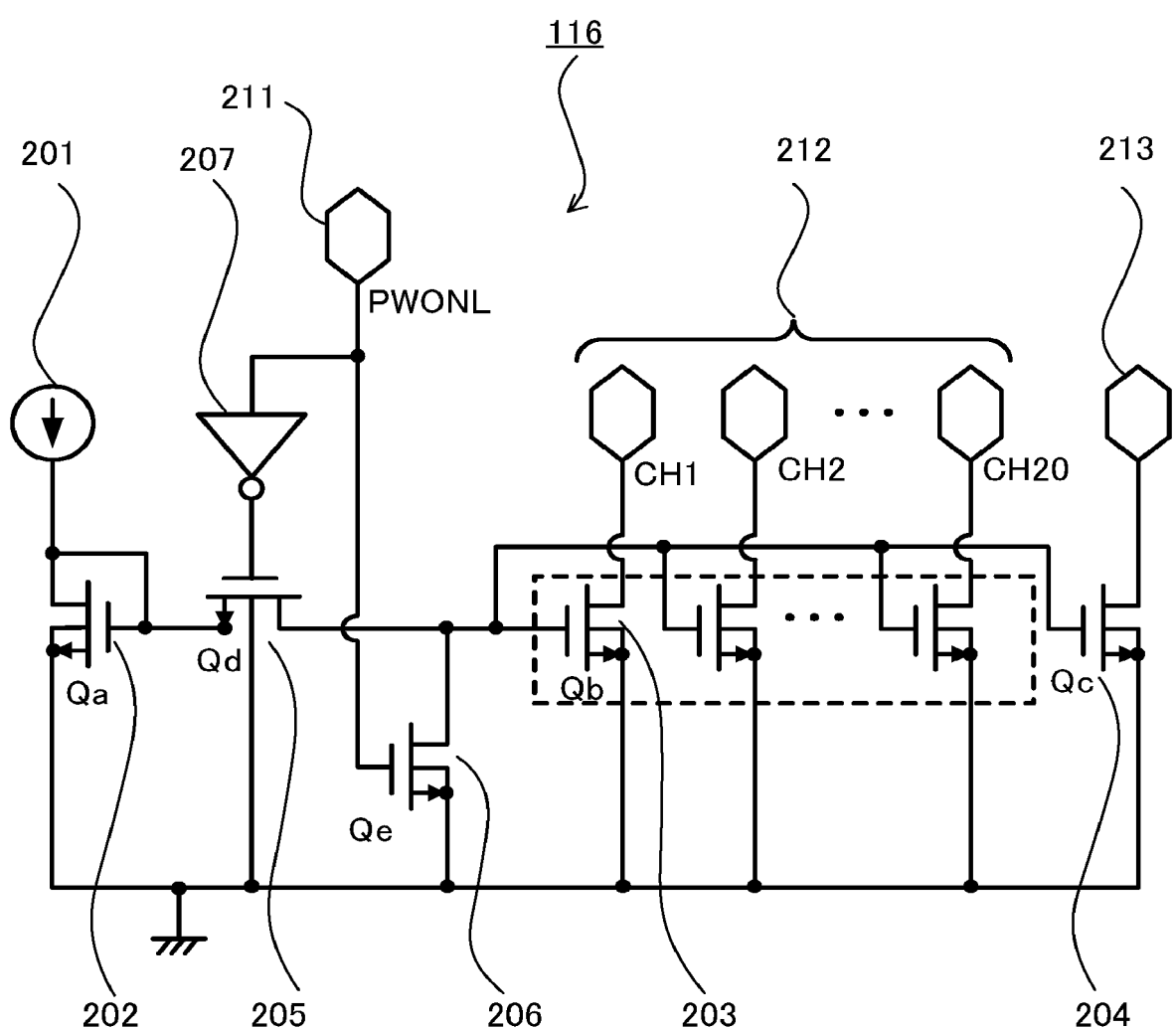
FIG. 3 is a diagram illustrating a configuration of a bias current circuit according to Embodiment 1.

The bias current circuit 116 performs or stops supplying of the bias current to the output amplifier 113 and each of the channel amplifiers 111. FIG. 3 is a diagram illustrating a configuration of the bias current circuit 116. As illustrated in FIG. 3, the bias current circuit 116 includes a standard current source 201 and a current mirror circuit including N-type metal-oxide-semiconductor field-effect transistors (MOSFETs) 202, 203, and 204 (Qa, Qb, and Qc).

The current of the standard current source 201 is input to a drain terminal of the N-type MOSFET 202 (Qa), the drain terminal and a gate terminal of the N-type MOSFET 202 (Qa) are connected together, and a source terminal is grounded. Further, performing and stopping the supplying of current are achieved by inserting an N-type MOSFET 205 (Qd) and an N-type MOSFET 206 (Qe) in the interval between the gate terminal of the N-type MOSFET 202 (Qa) and the mutually-interconnected gate terminals of the N-type MOSFETs 203 (Qb) and the N-type MOSFET 204 (Qc).

Specifically, one terminal type, either the drain terminal or the source terminal, of the N-type MOSFET 205 (Qd) is connected to the gate terminal of the N-type MOSFET 202 (Qa), and the other terminal type of the N-type MOSFET 205 (Qd) is connected to the gate terminals of the N-type MOSFETs 203 (Qb) and the N-type MOSFET 204 (Qc). Further, the drain terminal of the N-type MOSFET 206 (Qe) is connected to the gate terminals of the N-type MOSFETs 203 (Qb) and the N-type MOSFET 204 (Qc), and the source terminal of the N-type MOSFET 206 (Qe) is grounded.

A current control signal (PWONL) input via an input terminal 211 from the current supply-stoppage control circuit 17 is at a LOW level during outputting of current. This current control signal (PWONL) is input to the gate terminal of the N-type MOSFET 205 (Qd) via an inverter 207, and is input directly to the gate terminal of the N-type MOSFET 206 (Qe).

The N-type MOSFETs 205 (Qd) and 206 (Qe), due to insertion in a part through which the current of the current mirror does not flow, can be configured as N-type MOSFETs of the smallest size capable of manufacture by an integrated circuit (IC) production process. Further, since this current does not flow through the N-type MOSFETs 205 (Qd) and 206 (Qe), an operating point of the bias current circuit 116 is unaffected by the appending of the N-type MOSFETs 205 (Qd) and 206 (Qe). Further, switching is possible in a short period due to the switching between performing and stopping the supplying of current occurring in a state in which the power supply voltage is always applied.

Figure 4:
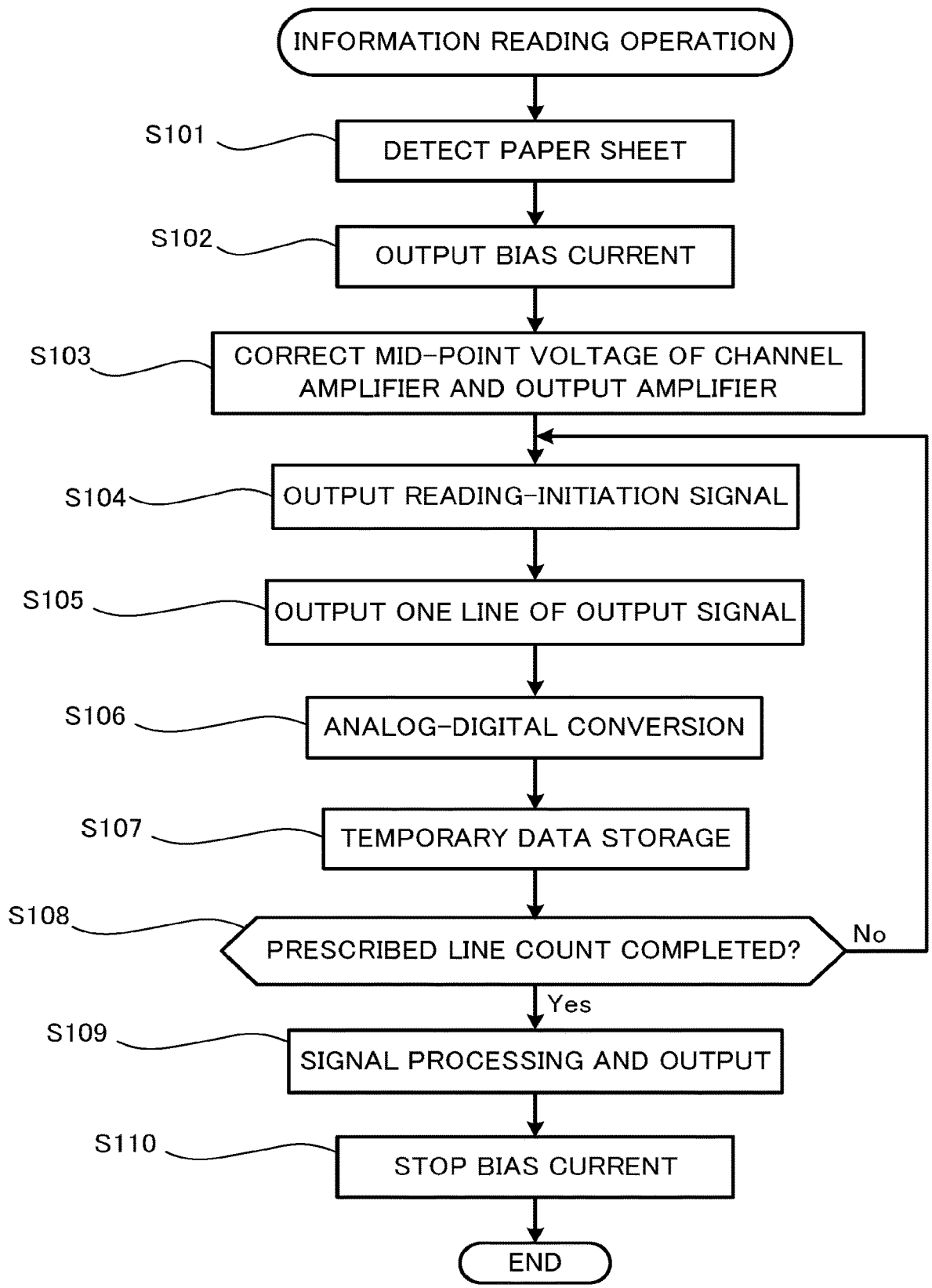
FIG. 4 is a flowchart illustrating operation of the signal processing device.
Figure 5:
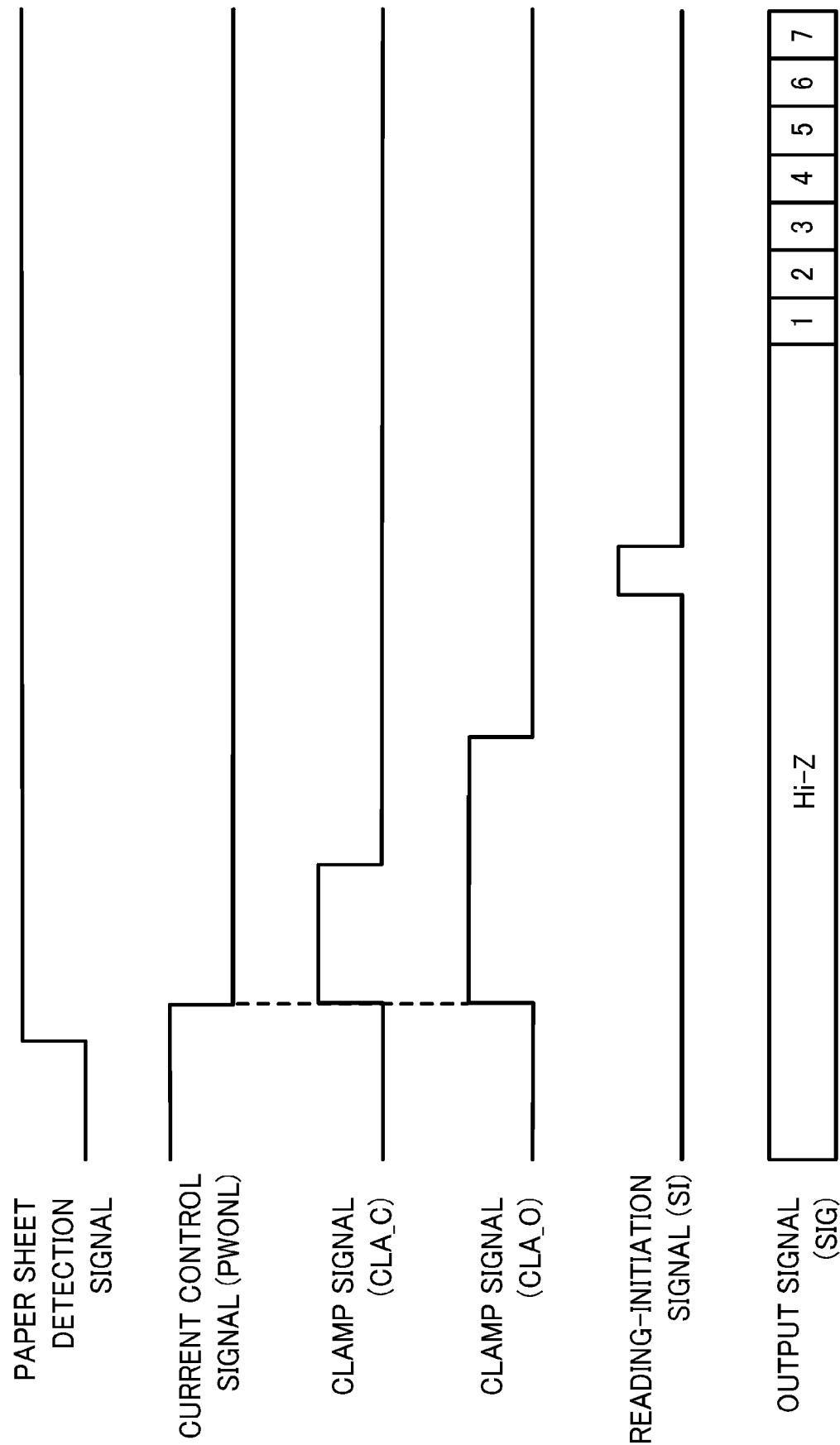
FIG. 5 is a timing chart of a reading-amplifying IC.

Operation of the signal processing device 1 configured in the aforementioned manner is described with reference to FIGS. 4 and 5. FIG. 4 is a flowchart illustrating operation of the signal processing device 1, and FIG. 5 is a timing chart of the reading-amplifying IC 11.

Operation of the signal processing device 1 starts from a state in which the bias current circuit 116 of the reading-amplifying IC 11 is stopping the bias current. When the paper sheet detector 15 does not detect that a paper sheet printed with magnetic ink is within the predetermined range, the paper sheet detection signal is LOW. At this time, the bias current control signal (PWONL) input to the input terminal 211 of the bias current circuit 116 of the reading-amplifying IC 11 from the current supply-stoppage control circuit 17 is HIGH.

When the bias current control signal (PWONL) is HIGH, the N-type MOSFET 205 (Qd) illustrated in FIG. 3 is turned OFF, and thus the drain-source connection of the N-type MOSFET 205 (Qd) becomes non-conductive. However, when the bias current control signal (PWONL) is HIGH, the N-type MOSFET 206 (Qe) is turned ON so that the drain-source connection of the N-type MOSFET 206 (Qe) is conductive, the gate terminals of the N-type MOSFETs 203 and 204 (Qb, Qc) are grounded, and current of the bias current output terminal 212 of the channel amplifier 111 and current of the bias current output terminal 213 of the output amplifier 113 are stopped.

When the paper sheet detector 15 detects that the paper sheet is present within the predetermined range (step S101) so that the paper sheet detection signal is HIGH, the current supply-stoppage control circuit 17 sets LOW the bias current control signal (PWONL) input via the input terminal 211 to the bias current circuit 116 of the reading-amplifying IC 11.

When the bias current control signal (PWONL) is LOW, the N-type MOSFET 205 (Qd) is turned ON, and thus the drain-source connection of the N-type MOSFET 205 (Qd) becomes conductive. However, when the bias current control signal (PWONL) is LOW, the N-type MOSFET 206 (Qe) is turned OFF, and thus the drain-source connection of the N-type MOSFET 206 (Qe) becomes non-conductive. Thus the connection between the gate terminal of the N-type MOSFET 202 (Qa) and the gate terminals of the N-type MOSFETs 203 (Qb) and the N-type MOSFET 204 (Qc) is conductive, resulting in operation as a normal current mirror circuit. At this time, the bias current is supplied via the output terminal 212 to the channel amplifier 111, and the bias current is supplied via the output terminal 213 to the output amplifier 113 (step S102).

At a timing when the bias current control signal (PWONL) becomes LOW, the clamp signal (CLA_C) for the channel amplifier 111 output from the reading control circuit 16 becomes HIGH. Thereafter, a clamp circuit included in each of the channel amplifiers 111 corrects the operating point of the channel amplifier 111 in accordance with the mid-point voltage of the MR element bridge including the MR element 101 and the MR element 102 of the channel (step S103).

Further, at the timing when the bias current control signal (PWONL) becomes LOW, a clamp signal (CLAO) for the output amplifier 113 output from the reading control circuit 16 becomes HIGH. Thereafter, a clamp circuit included in the output amplifier 113 corrects the operating point of the output amplifier 113 in accordance with the mid-point voltage of a mounted standard resistance bridge for correction or an output of a channel amplifier 111 of a predetermined channel (step S103).

After clamp signals (CLA_C, CLA_O) set HIGH in step S103 are set LOW, the reading control circuit 16 outputs a pulse signal of a fixed length at the HIGH level as the reading-initiation signal (SI) (step S104).

The reading-initiation signal (SI) is output as a pulse every line period until a predetermined line count is read out.

The channel amplifier 111 of each channel of the reading-amplifying IC 11 amplifies a signal that is the mid-point voltage of the MR bridge of the respective channel of the sensor 10 from which a direct-current component is removed. The channel-output switch control circuit 115 firstly makes the output switch 114 conductive. Thereafter, the channel switches 112 are made conductive or non-conductive sequentially one channel at a time so that the amplification signal amplified by the channel amplifier 111 is output from the number 1 channel through the number 20 channel. Thus a serial-type output signal (SIG) of a single line is output (step S105).

The output signal (SIG) of the single line output from the reading-amplifying IC 11 is amplified by the amplifier 12 and is converted by the AD converter 13 to a digital signal (step S106). The digital signal converted by the AD converter 13 is stored temporarily by the digital signal processing circuit 14 (step S107).

When the temporarily stored data reaches a prescribed line count, the digital signal processing circuit 14 determines that reading of the prescribed line count is completed (step S108). If the reading of the lines of the prescribed line count is not completed (No in step S108), processing returns to step S104. The steps S104 to S108 are repeated until determination is made that reading of the prescribed line count is completed.

If the reading of the prescribed line count is determined in step S108 to be completed (Yes in step S108), the digital signal processing circuit 14 performs signal processing of the temporarily stored data, and then outputs the signal-processed data as magnetic sensor detection data (step S109).

In parallel with the signal processing and the data outputting, the bias current circuit 116 stops the bias current of the channel amplifier 111 and the output amplifier 113 (step S110), and the operation is completed. Specifically, after the digital signal processing circuit 14 reads the prescribed line count, if the paper sheet detector 15 does not detect that the paper sheet is within the predetermined range, then the paper sheet detection signal becomes LOW. Upon receiving this signal, the current supply-stoppage control circuit 17 sets HIGH the bias current control signal (PWONL) input to the bias current circuit 116.

When the bias current control signal (PWONL) is HIGH, the N-type MOSFET 205 (Qd) illustrated in FIG. 3 is turned OFF so that the drain-source connection of the N-type MOSFET 205 (Qd) becomes non-conductive. However, when the bias current control signal (PWONL) becomes HIGH, the N-type MOSFET 206 (Qe) is turned ON so that the drain-source connection of the N-type MOSFET 206 (Qe) becomes conductive, the gate terminals of the N-type MOSFETs 203 and 204 (Qb, Qc) are grounded, and the current of the output terminal 212 of the bias current for the channel amplifier 111 and the current of the output terminal 213 of the bias current for the output amplifier 113 are stopped.

In this manner, in the period in which the paper sheet is not detected, that is, the period between paper sheets and the period prior to detecting of the paper sheet, the signal processing device 1 can be in a state in which the bias current is stopped so that current does not flow in the channel amplifier 111 and the output amplifier 113.

That is to say, in the period of non-detection of the paper sheet, the bias currents of the channel amplifiers 111 connected to the mid-points of each MR bridge of the sensor 10 and the subsequent stage output amplifier 113 are stopped, and in the case in which multiple MR bridges of each of the channels are linearly arranged, such operation enables a decrease in the current of the signal processing device 1 and a decrease in power consumption.

Further, by the bias current circuit 116 achieving the current supplying-stopping function by use of N-type MOSFETs of the smallest size capable of manufacture in an integrated circuit (IC) production process, the bias current circuit 116 can be configured as a small-sized/small-footprint circuit. Further, due to realization of the current supplying-stopping function by use of smallest-size N-type MOSFETs, the elements including these MOSFETs can be incorporated into the reading-amplifying IC 11, and further miniaturization is obtained by making an IC chip in combination with other elements including operational amplifiers. Further, the switching between performing and stopping the supplying of current occurs in a state in which the power supply voltage is always applied, and thus the switching between performing and stopping the supplying of current can be performed in a short period.

As described above, the signal processing device 1 according to the present embodiment is equipped with a reading-amplifying IC 11 that has a function for amplifying and outputting the mid-point voltages of the MR elements 101 and 102 of the sensor 10. The reading-amplifying IC 11 includes the bias current circuit 116 that performs and stops supplying of the bias current to the channel amplifiers 111 and the output amplifier 113. The bias current circuit 116 includes the N-type MOSFET 202 in which the drain terminal and the gate terminal are connected to the current source 201, and the N-type MOSFETs 203 and 204 for which the source terminals are grounded and the drain terminals are connected to the output terminals 212 and 213 of the bias current circuit 116. Further, the bias current circuit 116 includes: the N-type MOSFET 205 for which one terminal type, the drain terminal or the source terminal, is connected to the gate terminal of the N-type MOSFET 202, and the other terminal type of the N-type MOSFET 205 is connected to the gate terminals of the N-type MOSFETs 203 and 204; and the N-type MOSFET 206 for which the source terminal is grounded and the drain terminal is connected to the gate terminals of the N-type MOSFETs 203 and 204. Further, the control signal, that becomes LOW when the bias current is supplied to the channel amplifiers 111 and the output amplifier 113 and becomes HIGH when the supplying of the bias current is stopped, is input to the gate terminal of the N-type MOSFET 206, and the inverse signal of the control signal is input to the gate terminal of the N-type MOSFET 205. Thus the bias current circuit 116 of the channel amplifiers 111 and the output amplifier 113 of the reading-amplifying IC 11 is configured by a simple circuit, and a single control signal can be used for switching between performing and stopping the supplying of the bias current.

Embodiment 2

The overall configuration of the signal processing device 1 according to Embodiment 2 of the present disclosure is similar to the configuration of Embodiment 1. The configuration of the bias current circuit 316 included in the reading-amplifying IC 11 differs from the configuration of Embodiment 1. The other configuration of the reading-amplifying IC 11 is similar to the configuration of Embodiment 1.

Figure 6:
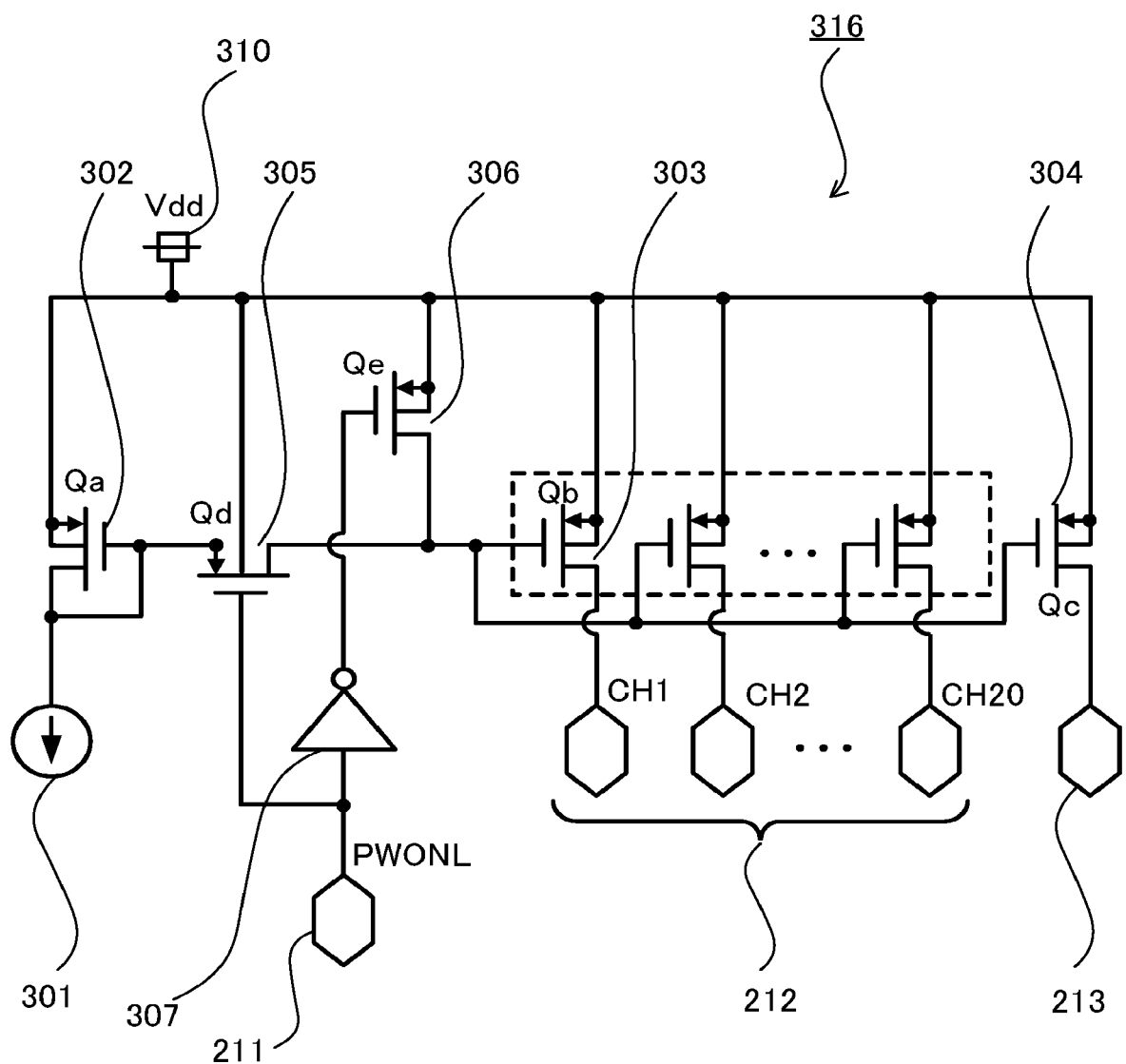
FIG. 6 is a drawing illustrating a configuration of a bias current circuit according to Embodiment 2 of the present disclosure.

FIG. 6 is a drawing illustrating a configuration of the bias current circuit 316 according to the present embodiment. The configuration of the bias current circuit 316 is described below in detail.

The bias current circuit 316 performs or stops the supplying of the bias current to each of the channel amplifiers 111 and the output amplifier 113. As illustrated in FIG. 6, the bias current circuit 316 includes a standard current source 301 and a current mirror circuit that includes P-type MOSFETs 302, 303, and 304 (Qa, Qb, and Qc).

The current of the standard current source 301 is input to a drain terminal of the P-type MOSFET 302 (Qa), the drain terminal and a gate terminal of the P-type MOSFET 302 are connected together, and the source terminal of the P-type MOSFET 302 is connected to a standard voltage source 310. Further, performing and stopping the supplying of current are achieved by inserting a P-type MOSFET 305 (Qd) and a P-type MOSFET 306 (Qe) in the interval between the gate terminal of the P-type MOSFET 302 (Qa) and mutually-interconnected gate terminals of the P-type MOSFETs 303 (Qb) and the P-type MOSFET 304 (Qc).

Specifically, one terminal type, either the drain terminal or the source terminal, of the P-type MOSFET 305 (Qd) is connected to the gate terminal of the P-type MOSFET 302 (Qa), and the other terminal type of the P-type MOSFET 305 (Qd) is connected to the gate terminals of the P-type MOSFETs 303 (Qb) and the P-type MOSFET 304 (Qc). Further, the drain terminal of the P-type MOSFET 306 (Qe) is connected to the gate terminals of the P-type MOSFETs 303 (Qb) and the P-type MOSFET 304 (Qc), and the source terminal of the P-type MOSFET 306 is connected to the standard voltage source 310. Further, the source tenninals of the P-type MOSFETs 303 (Qb) and the P-type MOSFET 304 (Qc) are connected to the standard voltage source 310.

Level of the control signal (PWONL) input from the current supply-stoppage control circuit 17 is LOW during outputting of current. This control signal (PWONL) is directly input to the gate terminal of the P-type MOSFET 305 (Qd), and is input to the gate terminal of the P-type MOSFET 306 (Qe) via an inverter 307.

The P-type MOSFETs 305 (Qd) and 306 (Qe) are inserted into a part through which current does not flow in the current mirror circuit, and thus the P-type MOSFETs 305 (Qd) and 306 (Qe) can be configured as P-type MOSFETs of the smallest size capable of manufacture by an integrated circuit (IC) production process. Further, since this current does not flow through the P-type MOSFETs 305 (Qd) and 306 (Qe), an operating point of the bias current circuit 316 is unaffected by the appending of the P-type MOSFETs 305 (Qd) and 306 (Qe). Further, switching is possible in a short period due to the switching between performing and stopping the supplying of current occurring in a state in which the power supply voltage is always applied.

The only difference, relative to Embodiment 1, is that the operations of stopping and supplying the bias current are different in the processing of the signal processing device 1 including the reading-amplifying IC 11 including the bias current circuit 316 configured in the aforementioned manner, and thus such operations are described below.

The paper sheet detection signal is LOW when the paper sheet detector 15 does not detect that the paper sheet printed with the magnetic ink. At this time, the bias current control signal (PWONL) input to the bias current circuit 316 of the reading-amplifying IC 11 via the input terminal 211 of the current supply-stoppage control circuit 17 is HIGH.

When the bias current control signal (PWONL) is HIGH, the P-type MOSFET 305 (Qd) illustrated in FIG. 6 is turned OFF so that the drain-source connection of the P-type MOSFET 305 (Qd) becomes non-conductive. However, when the bias current control signal (PWONL) is HIGH, the P-type MOSFET 306 (Qe) is turned ON so that the drain-source connection of the P-type MOSFET 306 (Qe) becomes conductive, the gate terminals of the P-type MOSFETs 303 and 304 (Qb, Qc) are pulled up to Vdd, and current of the output terminal 212 of the bias current for the channel amplifier 111 and current of the output terminal 213 of the bias current for the output amplifier 113 are stopped.

When the paper sheet detector 15 detects that the paper sheet is present within the predetermined range (step S101 of FIG. 4) so that the paper sheet detection signal becomes HIGH, the current supply-stoppage control circuit 17 sets LOW the bias current control signal (PWONL) input via the input terminal 211 to the bias current circuit 316 of the reading-amplifying IC 11.

When the bias current control signal (PWONL) becomes LOW, the P-type MOSFET 305 is turned ON, and thus the drain-source connection of the P-type MOSFET 305 becomes conductive. However, when the bias current control signal (PWONL) becomes LOW, the P-type MOSFET 306 (Qe) is turned OFF, and thus the drain-source connection of the P-type MOSFET 306 (Qe) becomes non-conductive. Thus a normal current mirror circuit operates in which there is a conductive state between the gate terminal of the P-type MOSFET 302 (Qa) and the gate terminals of the P-type MOSFETs 303 (Qb) and the P-type MOSFET 304 (Qc). At this time, the bias current is supplied via the output terminal 212 to the channel amplifier 111, and the bias current via the output terminal 213 is supplied to the output amplifier 113 (step S102 of FIG. 4).

As described above, according to the present embodiment, the bias current circuit 316 for providing and stopping supplying of bias current to the channel amplifiers 111 and the output amplifier 113 includes: the P-type MOSFET 302 for which the drain terminal and the gate terminal are connected to the current source 301 and the source terminal is connected to the standard voltage source 310; and P-types MOSFETs 303 and 304 for which the source terminals are connected to the standard voltage source 310 and the drain terminals are connected to the output terminals 212 and 213 of the bias current. The bias current circuit 316 further includes: the P-type MOSFET 305 for which one terminal type, either the drain terminal or the source terminal, is connected to the gate terminal of the P-type MOSFET 302, and the other terminal type of the P-type MOSFET 305 is connected to the gate terminals of the P-type MOSFETs 303 and 304; and the P-type MOSFET 306 for which the source terminal connects to the standard voltage source 310 and the drain terminal connects to the gate terminals of the P-type MOSFETs 303 and 304. Further, the control signal, that is at LOW level when the bias current is supplied to the channel amplifiers 111 and the output amplifier 113 and is at HIGH level when the bias current is stopped, is input to the gate terminal of the P-type MOSFET 305, and the inverse signal of the control signal is input to the P-type MOSFET 306. Thus the bias current circuit 316 of the channel amplifiers 111 and the output amplifier 113 of the reading-amplifying IC 11 is configured as a simple circuit even when using P-type MOSFETs, and a single control signal can be used for switching between performing and stopping the supplying of the bias current.

Embodiment 3

Figure 7:
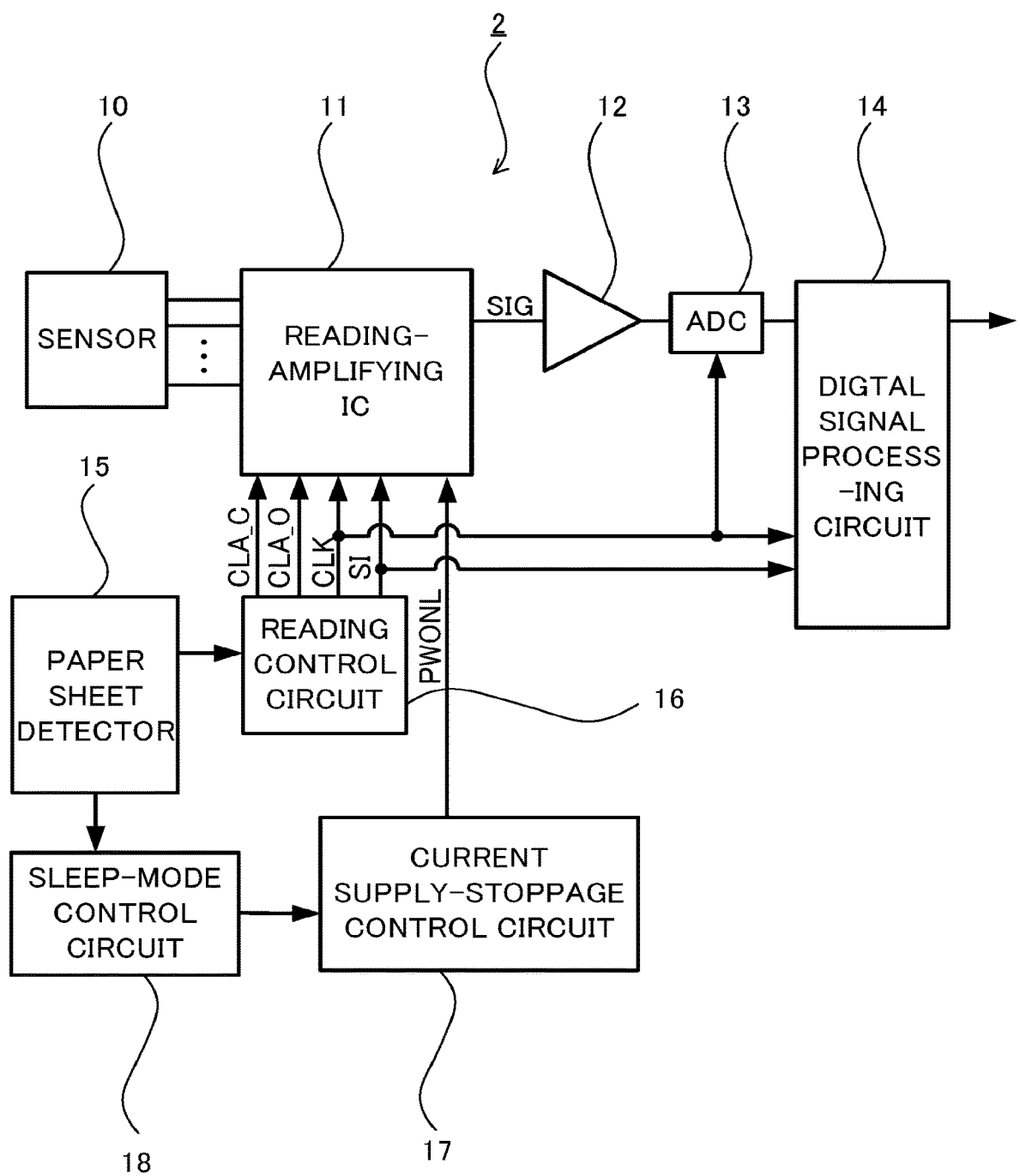
FIG. 7 is a block diagram illustrating a configuration of a signal processing device according to Embodiment 3 of the present disclosure.

FIG. 7 illustrates a configuration of a signal processing device 2 according to Embodiment 3 of the present disclosure. As illustrated in FIG. 7, the signal processing device 2 according to the present embodiment differs from the signal processing device 1 of Embodiment 1 in that a sleep-mode control circuit 18 is provided between the paper sheet detector 15 and the current supply-stoppage control circuit 17. The configuration, except for the sleep-mode control circuit 18, is similar to the configuration of Embodiment 1.

The sleep-mode control circuit 18 performs control of ON-OFF switching of a sleep mode of the signal processing device 2. When the paper sheet is detected to be present during detection of presence or absence of the paper sheet by the paper sheet detector 15, the bias current is output to the channel amplifiers 111 and the output amplifier 113 in Embodiment 1. However, in most cases, the paper sheets are actually conveyed continuously, and there is almost no interval until conveyance of the next paper sheet. In order to respond to such cases, Embodiment 3 is configured such that the bias current is not stopped each time there is no detection of the paper sheet, and the sleep mode is set ON so that the bias current stops only when the conveyance of the paper sheet is stopped for a fixed period.

Figure 8:
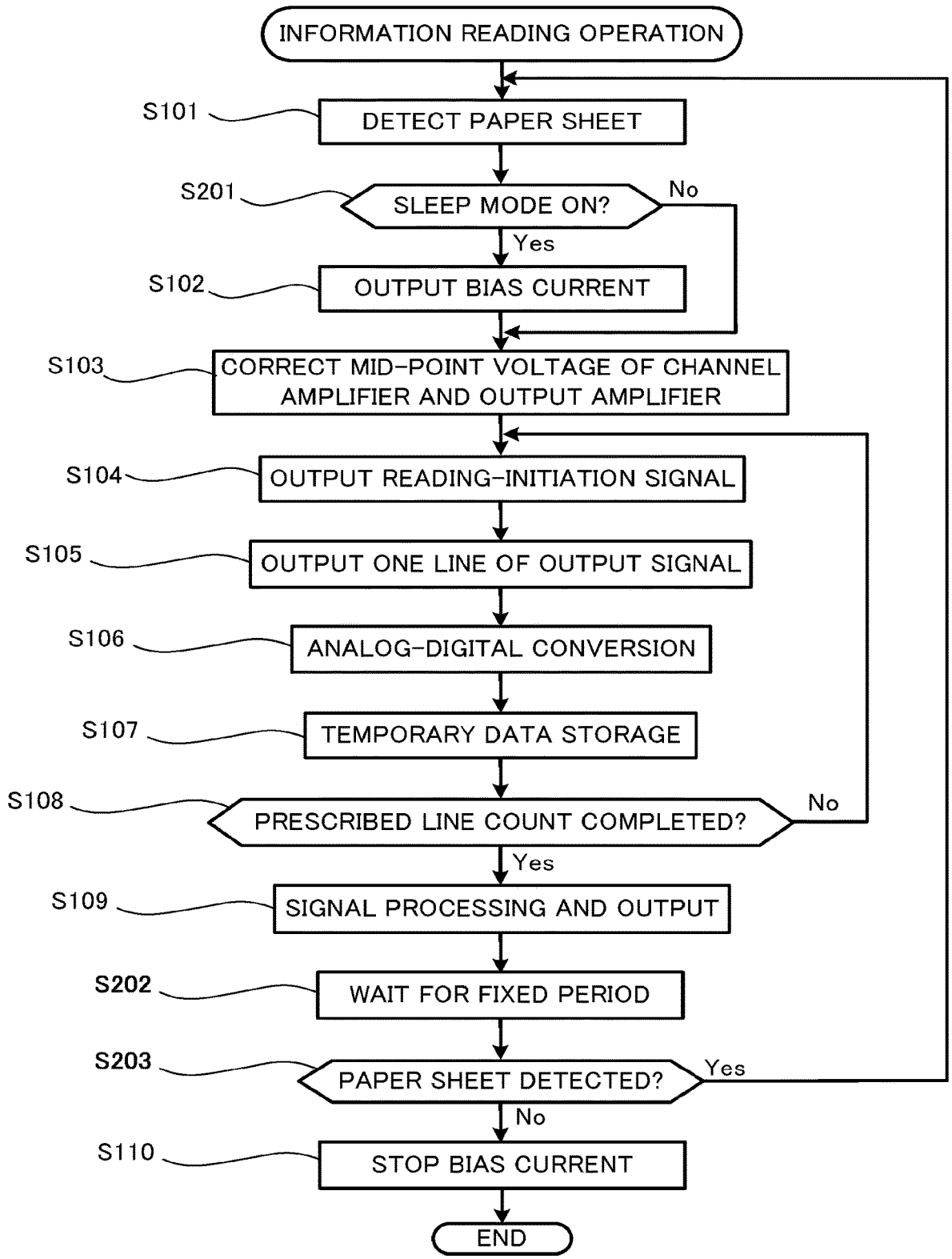
FIG. 8 is a flowchart illustrating operation of the signal processing device.

FIG. 8 is a flowchart illustrating operation of the signal processing device 2. Processing for which the same number is assigned as that of the flowchart of FIG. 4 is similar in detail to such processing of Embodiment 1, and thus description of such processing is omitted.

When the paper sheet detector 15 detects that the paper sheet is present within the predetermined range (step S101), the sleep-mode control circuit 18 determines whether the sleep mode is in the ON state (step S201). If the sleep mode is ON (Yes in step S201), the current supply-stoppage control circuit 17 outputs the bias current control signal to cause outputting of the bias current to the bias current circuit 116 of the reading-amplifying IC 11 (step S102). Then the sleep-mode control circuit 18 turns the sleep mode OFF. If the sleep mode in step S201 is OFF (No in step S201), due to the bias current being output, the mid-point voltage correction of the channel amplifiers 111 and the output amplifier 113 are performed as is (step S103).

The processing of steps S103 to S108 is executed, and even after execution of the signal processing and outputting in step S109, waiting for a fixed period occurs in a state in which the bias current continues to be output (step S202). If the paper sheet is not detected during a fixed period, such as 1 min (No in step S203), the sleep mode is switched ON, and the bias current is stopped (step S110). If the paper sheet is detected during the fixed period (Yes in step S203), processing returns to step S101, and the reading of the next paper sheet starts without stoppage of the bias current.

As described above, according to the present embodiment, if the paper sheet is not detected by the paper sheet detector 15 for a fixed period, the sleep-mode control circuit 18 switches the sleep mode ON, and the bias current stops. If the next paper sheet is detected within the fixed period, the outputting of the bias current continues in the sleep mode-OFF state. Thus in a case such as when the paper sheets are conveyed continuously, short period stoppage of the bias current of the channel amplifiers 111 and the output amplifier 113 does not occur, and thus operation is stabilized.

In the present disclosure in this manner, the bias current circuit includes a current mirror circuit that includes: the first field-effect transistor in which the drain terminal and gate terminal are connected to the current source, and the second field-effect transistor in which the drain terminal is connected to an electronic circuit being supplied the bias current. The first switching element connects between the gate terminal of the first field-effect transistor and the gate terminal of the second field-effect transistor; and the second switching element connects between the gate terminal and the source terminal of the second field-effect transistor. A control signal for switching in response to whether bias current is supplied is input to the control terminal of the first switching element, and an inverse signal of the control signal is input to the control terminal of the second switching element. When the bias current is supplied to the electronic circuit, the first switching element is made conductive and the second switching element is made non-conductive on the basis of this control signal, and then when the bias current to the electronic circuit stops, the first switching element is made non-conductive and the second switching element is made conductive on the basis of this control signal. Thus switching between supplying and stopping the bias current can be performed by a simple configuration using a single control signal.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

Figure 9:
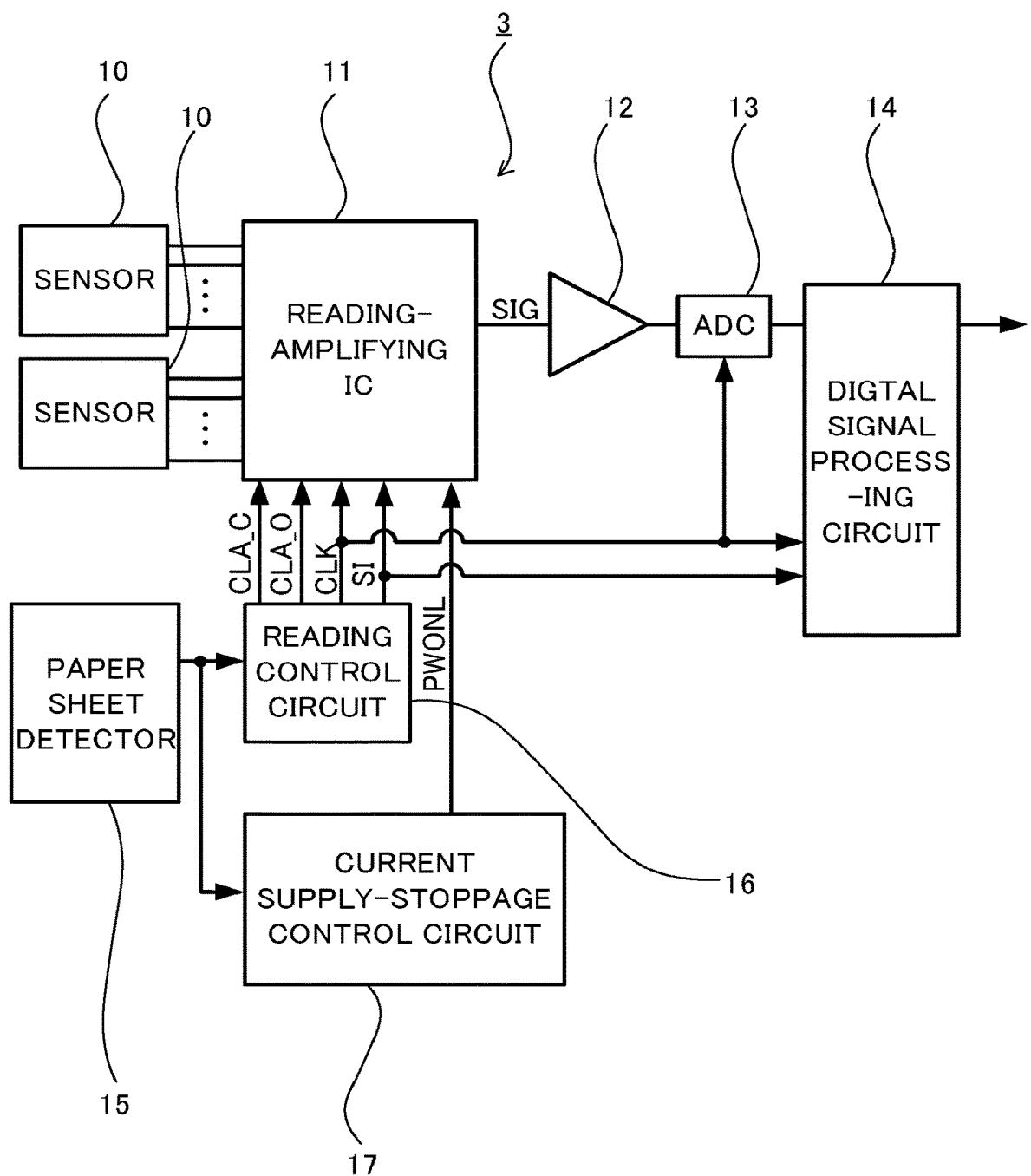
FIG. 9 is a block diagram illustrating another configuration of the signal processing device.

For example, although the signal processing devices 1 and 2 in the aforementioned embodiments are configured to use the reading-amplifying IC 11 to read and amplify the output of the sensor 10 that includes 20 channels of MR bridges, other configurations may be used. FIG. 9 is a block diagram illustrating a signal processing device 3 of another configuration. As illustrated in FIG. 9, the signal processing device 3 may be configured to use the reading-amplifying IC 11 to read and amplify the output of a plurality of sensors 10 of a freely-selected number of channels. Further, each of the sensors 10 may be connected of a respective reading-amplifying IC 11 of a plurality of reading-amplifying ICs 11, and the current supply-stoppage control circuit 17 may perform and stop supplying of the bias current to each of the reading-amplifying ICs 11.

Further, although the MR elements 101 and 102 included in the sensor 10 detect magnetic information, sensor elements may be used that detect other freely-selected information. For example, the sensor 10 may be configured as an image sensor that includes light-receiving elements.

Further, although the control signal (PWONL) is input so that the MOSFETs 205, 206, 305, and 306 switch between conductivity and non-conductivity, freely-selected switching elements other than the MOSFETs 205, 206, 305, and 306 may be used. For example, another type of field-effect transistor may be used.

Further, although the current mirror circuit included in the bias current circuit 116 includes the N-type MOSFETs 202-204 or the P-type MOSFETs 302-304, the configuration may use another type of field-effect transistor.

Further, although the bias current circuit 116 performs and stops supplying of bias current to each of the channel amplifiers 111 and the output amplifier 113, the bias current circuit 116 may be used for performing and stopping supplying of the bias current to another freely-selected electronic circuit.

This application claims the benefit of Japanese Patent Application No. 2016-096394, filed on May 12, 2016, the entire disclosure of which is incorporated by reference herein.

INDUSTRIAL APPLICABILITY 1, 2, 3 Signal processing device
10 Sensor
11 Reading-amplifying IC
12 Amplifier
13 AD converter
14 Digital signal processing circuit
15 Paper sheet detector
16 Reading control circuit
17 Current supply-stoppage control circuit
18 Sleep-mode control circuit
101, 102 MR element
103 MR power source
104 GND 111 Channel amplifier
112 Channel switch
113 Output amplifier
114 Output switch
115 Channel-output switch control circuit
116, 316, 416 Bias current circuit
201, 301 Current source
202-206 N-type MOSFET
207, 307 Inverter
211 Input terminal
212, 213 Output terminal
302-306 P-type MOSFET
310 Standard voltage source

The invention claimed is:

1. A bias current circuit comprising:
a first field-effect transistor in which a current source is connected to a drain terminal and a gate terminal;
a second field-effect transistor in which a first electronic circuit to be supplied a bias current is connected to a drain terminal;
a third field-effect transistor in which a source terminal is connected to the gate terminal of the first field-effect transistor and a drain terminal is connected to a gate terminal of the second field-effect transistor;
a fourth field-effect transistor in which a drain terminal and a source terminal are respectively connected to the gate terminal and a source terminal of the second field-effect transistor; and
a plurality of fifth field-effect transistors in which each gate terminal of gate terminals is connected to the gate terminal of the second field-effect transistor and each source terminal of source terminals is connected to the source terminal of the second field-effect transistor, wherein
each of a plurality of second electronic circuits to be supplied the bias current is connected to a respective drain terminal of the fifth field-effect transistors,
each of the plurality of second electronic circuits is connected to the first electronic circuit via a switch of a plurality of switches corresponding to the second electronic circuits, each second electronic circuit becoming electrically connected to the first electronic circuit when the corresponding switch is made conductive,
the first, second, third, fourth, and fifth field-effect transistors are P-type metal oxide semiconductor field effect transistors (MOSFETs),
a positive voltage source is connected to the source terminals of the first, second, fourth, and fifth field-effect transistors,
a control signal for switching in response to whether the bias current is to be supplied is input to a gate terminal of the third field-effect transistor, and an inverse signal of the control signal is input to a gate terminal of the fourth field-effect transistor,
when the bias current is to be supplied to the first electronic circuit and the second electronic circuit, the control signal is set to a low level, connection is made conductive between the drain terminal and the source terminal of the third field-effect transistor, and connection is made non-conductive between the drain terminal and the source terminal of the fourth field-effect transistor, and
when supplying of the bias current is to be stopped to the first electronic circuit and the second electronic circuit, the control signal is set to a high level, connection is made non-conductive between the drain terminal and the source terminal of the third field-effect transistor, and connection is made conductive between the drain terminal and the source terminal of the fourth field-effect transistor.

2. The bias current circuit according to claim 1, wherein the plurality of switches switch sequentially in accordance with a clock signal based on a signal input from the outside, and
the control signal is generated based on the signal input from the outside.

3. A signal processing device for outputting an amplification signal amplified by an electronic circuit for amplifying a sensor signal output from each of a plurality of sensor elements, comprising:
the bias current circuit according to claim 1, wherein
each of the plurality of second electronic circuits is a channel amplifier of a corresponding plurality of channel amplifiers, the channel amplifier amplifying an output from a sensor element of the sensor elements,
the first electronic circuit is an output amplifier for outputting the amplification signal for amplifying an output from the second electronic circuits upon the switch being made conductive to interconnect the first electronic circuit and the second electronic circuit,
the bias current is supplied to the first electronic circuit and the second electronic circuits when the amplification signal is output, and
supplying of the bias current to the first electronic circuit and the second electronic circuit is stopped when the amplification signal is not output.

4. The signal processing device according to claim 3, further comprising:
a paper sheet detector to detect existence or non-existence of a paper sheet; and
a sleep-mode control circuit to switch a sleep mode from off to on when the paper sheet detector detects non-existence of the paper sheet for a fixed period, wherein
the bias current circuit stops the bias current when the sleep mode is on.

5. The signal processing device according to claim 3, wherein the sensor signal is a signal detecting magnetic information included in the paper sheet.

6. The signal processing device according to claim 4, wherein the sensor signal is a signal detecting magnetic information included in the paper sheet.

7. A signal processing device for outputting an amplification signal amplified by an electronic circuit for amplifying a sensor signal output from each of a plurality of sensor elements, comprising:
the bias current circuit according to claim 2, wherein
each of the plurality of second electronic circuits is a channel amplifier of a corresponding plurality of channel amplifiers, the channel amplifier amplifying an output from a sensor element of the sensor elements,
the first electronic circuit is an output amplifier for outputting the amplification signal for amplifying an output from the second electronic circuits upon the switch being made conductive to interconnect the first electronic circuit and the second electronic circuit,
the bias current is supplied to the first electronic circuit and the second electronic circuits when the amplification signal is output, and
supplying of the bias current to the first electronic circuit and the second electronic circuit is stopped when the amplification signal is not output.

8. The signal processing device according to claim 7, further comprising:

a paper sheet detector to detect existence or non-existence of a paper sheet; and a sleep-mode control circuit to switch a sleep mode from off to on when the paper sheet detector detects non-existence of the paper sheet for a fixed period, wherein the bias current circuit stops the bias current when the sleep mode is on.

9. The signal processing device according to claim 7, wherein the sensor signal is a signal detecting magnetic information included in the paper sheet.

10. The signal processing device according to claim 8, wherein the sensor signal is a signal detecting magnetic information included in the paper sheet.

11. A bias current control method using a current mirror circuit including (i) a first field-effect transistor in which a current source is connected to a drain terminal and a gate terminal, (ii) a second field-effect transistor in which a first electronic circuit to be supplied a bias current is connected to a drain terminal, (iii) a third field-effect transistor in which a source terminal is connected to the gate terminal of the first field-effect transistor and a drain terminal is connected to a gate terminal of the second field-effect transistor, (iv) a fourth field-effect transistor in which a drain terminal and a source terminal are respectively connected to the gate terminal and a source terminal of the second field-effect transistor, and (v) a plurality of fifth field-effect transistors in which each gate terminal of gate terminals is connected to the gate terminal of the second field-effect transistor and each source terminal of source terminals is connected to the source terminal of the second field-effect transistor, wherein each of a plurality of second electronic circuits to be supplied the bias current is connected to a respective drain terminal of the fifth field-effect transistors, each of the plurality of second electronic circuits is connected to the first electronic circuit via a switch of a plurality of switches corresponding to the second electronic circuits, each second electronic circuit becoming electrically connected to the first electronic circuit when the corresponding switch is made conductive, the first, second, third, fourth, and fifth field-effect transistors are P-type metal oxide semiconductor field effect transistors (MOSFETs), a positive voltage source is connected to the source terminals of the first, second, fourth, and fifth field-effect transistors, a control signal for switching in response to whether the bias current is to be supplied is input to a gate terminal of the third field-effect transistor, and an inverse signal of the control signal is input to a gate terminal of the fourth field-effect transistor, the method comprises:

a bias current supplying step of making connection conductive between the drain terminal and the source terminal of the third field-effect transistor by inputting of the control signal at the low level to the gate terminal of the third field-effect transistor, and making connection non-conductive between the drain terminal and the source terminal of the fourth field-effect transistor by inputting of the inverse signal to the gate terminal of the fourth field-effect transistor, to supply the bias current to the first electronic circuit and the second electronic circuit, and a bias current stopping step of making connection non-conductive between the drain terminal and the source terminal of the third field-effect transistor by inputting of the control signal at the high level to the gate terminal of the third field-effect transistor, and making connection conductive between the drain terminal and the source terminal of the fourth field-effect transistor by inputting of the inverse signal to the gate terminal of the fourth field-effect transistor, to stop the supply of the bias current to the first electronic circuit and the second electronic circuit.

12. The bias current control method according to claim 11, wherein the plurality of switches switch sequentially in accordance with a clock signal based on a signal input from the outside, and the control signal is generated based on the signal input from the outside.

* * * * *